(12) United States Patent
Fuergut et al.

(10) Patent No.: US 11,646,258 B2
(45) Date of Patent: May 9, 2023

(54) ELECTRONIC DEVICES INCLUDING ELECTRICALLY INSULATED LOAD ELECTRODES

(71) Applicant: Infineon Technologies AG, Neubiberg (DE)

(72) Inventors: Edward Fuergut, Dasing (DE); Thomas Basler, Chemnitz (DE); Reinhold Bayerer, Reichelsheim (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 206 days.

(21) Appl. No.: 16/944,303

(22) Filed: Jul. 31, 2020

(65) Prior Publication Data

US 2021/0043555 A1    Feb. 11, 2021

(30) Foreign Application Priority Data

Aug. 6, 2019 (DE) ...................... 10 2019 121 229.4

(51) Int. Cl.

| | | |
|---|---|---|
| *H01L 23/498* | (2006.01) | |
| *H01L 23/66* | (2006.01) | |
| *H01L 21/56* | (2006.01) | |
| *H01L 21/48* | (2006.01) | |
| *H01L 23/29* | (2006.01) | |

(52) U.S. Cl.
CPC .... *H01L 23/49838* (2013.01); *H01L 21/4846* (2013.01); *H01L 21/565* (2013.01); *H01L 23/293* (2013.01); *H01L 23/66* (2013.01); *H01L 2223/6605* (2013.01)

(58) Field of Classification Search
CPC . H01L 23/49838; H01L 23/293; H01L 23/66; H01L 21/4846; H01L 21/565; H01L 21/293; H01L 21/66
See application file for complete search history.

(56) References Cited

U.S. PATENT DOCUMENTS

| | | |
|---|---|---|
| 6,261,131 B1 | 7/2001 | Kuroda et al. |
| 2016/0365296 A1 | 12/2016 | Otremba et al. |
| 2017/0098598 A1 | 4/2017 | Otremba et al. |
| 2017/0365951 A1 | 12/2017 | Zhang et al. |
| 2018/0102302 A1* | 4/2018 | Grassmann ............. H01L 23/66 |

(Continued)

FOREIGN PATENT DOCUMENTS

| | | |
|---|---|---|
| DE | 102016119078 | 4/2018 |
| EP | 2232652 | 9/2010 |

(Continued)

*Primary Examiner* — Marc Anthony Armand
(74) *Attorney, Agent, or Firm* — Dicke, Billig & Czaja, PLLC (57) ABSTRACT

An electronic device and method is disclosed. In one example, the electronic device includes an electrically insulating material, a first load electrode arranged on a first surface of the electrically insulating material, and a second load electrode arranged on a second surface of the electrically insulating material opposite to the first surface, wherein the load electrodes are separated by the electrically insulating material along the entire length on which the load electrodes have opposite sections, wherein surfaces of the load electrodes facing away from the electrically insulating material are uncovered by the electrically insulating material.

17 Claims, 9 Drawing Sheets

(56) References Cited

U.S. PATENT DOCUMENTS

2018/0221517 A1 8/2018 Trutwig et al.
2020/0357727 A1* 11/2020 Li ..................... H01L 23/49513

FOREIGN PATENT DOCUMENTS

| EP | 2447986 | 5/2012 |
| JP | H06-260583 | 9/1994 |
| WO | 2009/092413 | 7/2009 |

* cited by examiner

ELECTRONIC DEVICES INCLUDING ELECTRICALLY INSULATED LOAD ELECTRODES

CROSS-REFERENCE TO RELATED APPLICATION

This Utility Patent Application claims priority to German Patent Application No. 10 2019 121 229.4, filed Aug. 6, 2019, which is incorporated herein by reference.

TECHNICAL FIELD

The present disclosure relates to electronic devices in general. More particular, the present disclosure relates to electronic devices including electrically insulated load electrodes. In addition, the present disclosure relates to methods for manufacturing such electronic devices.

BACKGROUND

Electronic devices such as e.g. semiconductor devices may be manufactured in package form. For example, semiconductor packages may be soldered to a printed circuit board (PCB) via solder joints. In particular for high voltage applications, all electrical contacts of the electronic devices may require large clearances and large creepage distances which may result in an undesirable increase of parasitic commutation inductances. Manufacturers of electronic devices are constantly striving to improve their products and methods for manufacturing thereof. It may thus be desirable to develop electronic devices providing an improved performance and particularly having reduced parasitic inductances as well as methods for manufacturing such electronic devices.

SUMMARY

An aspect of the present disclosure relates to an electronic device. The electronic device comprises an electrically insulating material. The electronic device further comprises a first load electrode arranged on a first surface of the electrically insulating material. The electronic device further comprises a second load electrode arranged on a second surface of the electrically insulating material opposite to the first surface. The load electrodes are separated by the electrically insulating material along the entire length on which the load electrodes have opposite sections. Surfaces of the load electrodes facing away from the electrically insulating material are uncovered by the electrically insulating material.

A further aspect of the present disclosure relates to a method for manufacturing an electronic device. The method comprises arranging a chip carrier in an encapsulation tool, wherein a first lead of the chip carrier is configured as a contact electrode of the manufactured electronic device. The method further comprises pressing a surface of the first lead against a first surface of the encapsulation tool by means of a first retractable pin. The method further comprises encapsulating the chip carrier and the first lead by arranging an encapsulation material in the encapsulation tool, wherein the surface of the first lead is uncovered by the encapsulation material after encapsulating the chip carrier and the first lead.

BRIEF DESCRIPTION OF THE DRAWINGS

The accompanying drawings are included to provide a further understanding of aspects. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

FIG. 1 includes FIGS. 1A to 1C schematically illustrating cross-sectional views of an electronic device 100 in accordance with the disclosure.

FIG. 3 includes FIGS. 3A and 3B schematically illustrating perspective views of an electronic device 300 in accordance with the disclosure.

FIG. 4 includes FIGS. 4A and 4B schematically illustrating perspective views of an electronic device 400 in accordance with the disclosure.

FIG. 5 includes FIGS. 5A and 5B schematically illustrating perspective views of an electronic device 500 in accordance with the disclosure.

FIG. 6 includes FIGS. 6A and 6B schematically illustrating perspective views of an electronic device 600 in accordance with the disclosure.

FIG. 7 includes FIGS. 7A and 7B schematically illustrating a top view and a cross-sectional side view of an electronic device 700 in accordance with the disclosure.

FIG. 8 includes FIGS. 8A and 8B schematically illustrating a top view and a cross-sectional side view of an electronic device 800 in accordance with the disclosure.

FIG. 10 includes FIGS. 10A and 10B schematically illustrating perspective views of an electronic device 1000 in accordance with the disclosure.

FIG. 13 includes FIGS. 13A to 13F schematically illustrating a cross-sectional side view of a method for manufacturing an electronic device in accordance with the disclosure.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1A:
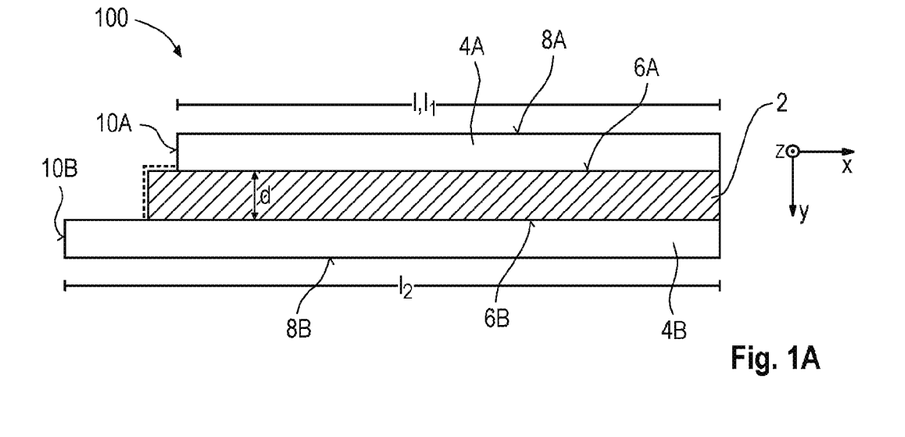
Figure 1B:
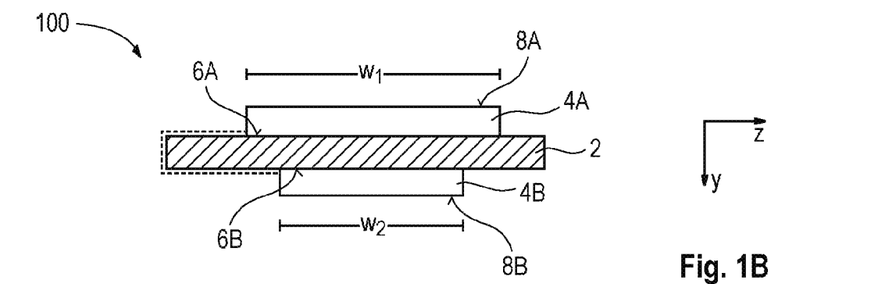
Figure 1C:
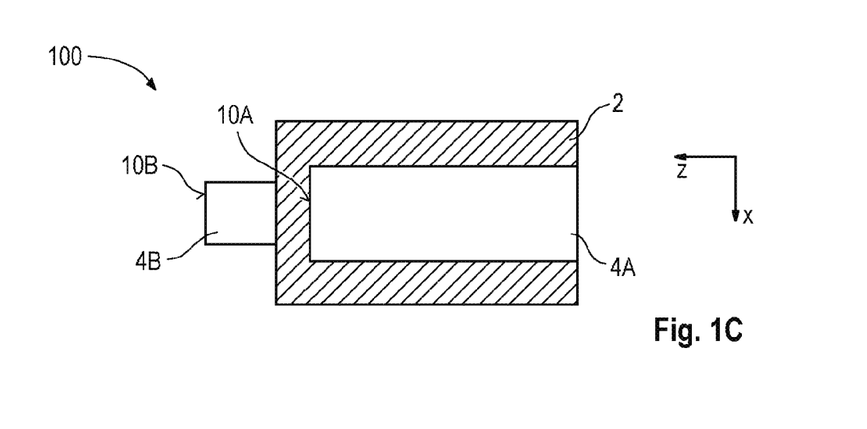

FIG. 1 includes FIGS. 1A to 1C schematically illustrating cross-sectional views of an electronic device 100 in accordance with the disclosure. FIGS. 1B and 1C illustrate the electronic device 100 of FIG. 1A when viewed in the x- and y-direction, respectively. The electronic device 100 is illustrated in a general manner in order to qualitatively specify aspects of the disclosure. The electronic device 100 may include further aspects which are not illustrated for the sake of simplicity. For example, the electronic device 100 may be extended by any of the aspects described in connection with other electronic devices and methods in accordance with the disclosure. Comments made in connection with FIG. 1 may likewise hold true for other electronic devices in accordance with the disclosure.

The electronic device 100 may include an electrically insulating material 2. A first load electrode 4A may be arranged on a first surface 6A of the electrically insulating material 2. In addition, a second load electrode 4B may be arranged on a second surface 6B of the electrically insulating material 2 opposite to the first surface 6A. The load electrodes 4A, 4B may be separated by the electrically insulating material 2 along the entire length l on which the load electrodes 4A, 4B have opposite sections. Surfaces 8A, 8B of the load electrodes 4A, 4B facing away from the electrically insulating material 2 may be uncovered by the electrically insulating material 2. The load electrodes 4A, 4B may be electrically connected to further components of the electronic device 100 which are not illustrated for the sake of simplicity.

The load electrodes 4A, 4B may extend in a substantially same or parallel direction. In the example of FIG. 1, the load electrodes 4A, 4B may have different lengths $l_1$, $l_2$ and/or different widths $w_1$, $w_2$. In further examples, the load electrodes 4A, 4B may have the same length and/or the same width. In the illustrated example, the length $l_1$ of the first load electrode 4A may correspond to the length l on which the load electrodes 4A, 4B have opposite sections. The load electrodes 4A, 4B may be separated by the electrically insulating material 2 by a distance d smaller than about 2.0 mm or smaller than about 1.0 mm or smaller than about 0.5 mm or smaller than about 0.4 mm or smaller than about 0.3 mm or smaller than about 0.2 mm or smaller than about 0.1 mm or even smaller than about 50 μm.

In conventional electronic devices, load electrodes of the devices may be separated by air, i.e. by air gaps. Here, a clearance between the load electrodes may need to be over a minimum value. The clearance may be defined as shortest distance through the air between two conductive elements. For example, a semiconductor package of a high voltage (e.g. 1200V) class may require a clearance of about 4.5 mm. Compared to this, the distance d of the electronic device 100 may have a reduced value. In one specific example, the required clearance of about 4.5 mm in a conventional device may be reduced to a value of about 20 μm in case the electrically insulating material 2 is made of or comprises a polyimide. The reduced distance d may minimize an inductance of the electronic device 100 as well as an inductance of a system including the electronic device 100, for example a PCB with the electronic device 100 mounted thereon. In particular, parasitic inductances in commutation circuits of systems including electronic devices in accordance with the disclosure may be reduced.

A creepage distance between the load electrodes 4A, 4B may extend along a surface of the electrically insulating material 2. A creepage distance may be defined as the shortest distance along the surface of a solid insulating material between two conductive parts. A creepage distance of the electronic device 100 may depend on the specific designs and dimensions of the electrically insulating material 2 and the load electrodes 4A, 4B. For example, a creepage distance may extend along paths which are exemplarily illustrated as dashed lines in FIGS. 1A and 1B, respectively.

When viewed in the y-direction (see e.g. FIG. 1C) the electrically insulating material 2 may extend over at least one side surface of at least one of the load electrodes 4A, 4B. In the example of FIG. 1, the electrically insulating material 2 may extend over both side surfaces of both load electrodes 4A, 4B, respectively. In a further example, the electrically insulating material 2 may extend over only one side surface of only one of the load electrodes 4A, 4B. In the example of FIG. 1, the electrically insulating material 2 may not necessarily cover or mechanically contact the respective side surface of the respective load electrode. In further examples, one or more of the side surfaces may be at least partly covered by the electrically insulating material 2. By extending the electrically insulating material 2 over one or more side surfaces of one or both of the load electrodes 4A, 4B, a creepage distance (see e.g. dashed line in FIG. 1B) of the electronic device 100 may be increased.

When viewed in the y-direction (see e.g. FIGS. 1A and 1C) the electrically insulating material 2 may extend over at least one of the end portions 10A, 10B of at least one of the load electrodes 4A, 4B. In the example of FIG. 1, the electrically insulating material 2 may extend over the end portion 10A of load electrode 4A. In a further example, the electrically insulating material 2 may extend over the end portions 10A, 10B of both load electrodes 4A, 4B. In the example of FIG. 1, the electrically insulating material 2 may not necessarily cover or mechanically contact the side surface of the end portion 10A. In further examples, the side surface of the end portion 10A may be at least partly covered by the electrically insulating material 2. By extending the electrically insulating material 2 over one or both of the end portions 10A, 10B, a creepage distance (see e.g. dashed line in FIG. 1A) of the electronic device 100 may be increased.

When viewed in the y-direction (see e.g. FIGS. 1B and 1C) the load electrodes 4A, 4B may at least partly overlap. In FIG. 1B, the width $w_2$ of the second load electrode 4B may completely lie in the bounds of the width $w_1$ of the first load electrode 4A. In further examples, the load electrodes 4A, 4B may not necessarily overlap when viewed in the y-direction. However, in such case the electrically insulating material 2 may still provide an electrical insulation between the load electrodes 4A, 4B.

The electrically insulating material 2 may include at least one of the following materials: dielectric printed circuit board material, ceramic material, polyimide, plastic, epoxy. That is, the electrically insulating material 2 may be a solid material. Compared to conventional electronic devices with air gaps between the load electrodes, electronic devices in accordance with the disclosure provide an increased mechanical robustness of the load electrodes 4A, 4B due to the solid consistency of the electrically insulating material 2.

The electronic device 100 may be configured to operate at a maximum voltage of higher than about 600V or higher than about 1200V or even higher than about 1700V. For example, high maximum voltages may have a value of about 2000V or even up to about 3.3 kV. It is understood that electronic devices in accordance with the disclosure and suitable for future applications may be configured to operate at even higher maximum voltages. Note that an actually applied voltage during an operation of the electronic device 100 may, for example, have a value which lies about 30% to about 40% below the maximum voltage value. The electronic device 100 may be configured to operate at a frequency (or a switching frequency) of higher than about 30 kHz or higher than about 100 kHz.

For example, the electronic device 100 may be used in a high voltage power module. In particular, semiconductor chips included in such high voltage power modules may e.g. be manufactured from a wide band gap semiconductor material or a compound semiconductor material (e.g. SiC, GaN, SiGe, GaAs). The electronic device 100 may be used in any kind of power module such as e.g. MOSFETs, half bridge circuits, power modules including a gate driver, etc. The power modules may be used in automotive, consumer and industrial applications. In particular, the power modules may be used in electro-mobility applications, such as e.g. charging stations, (electric) motor control circuits, etc.

Figure 2:
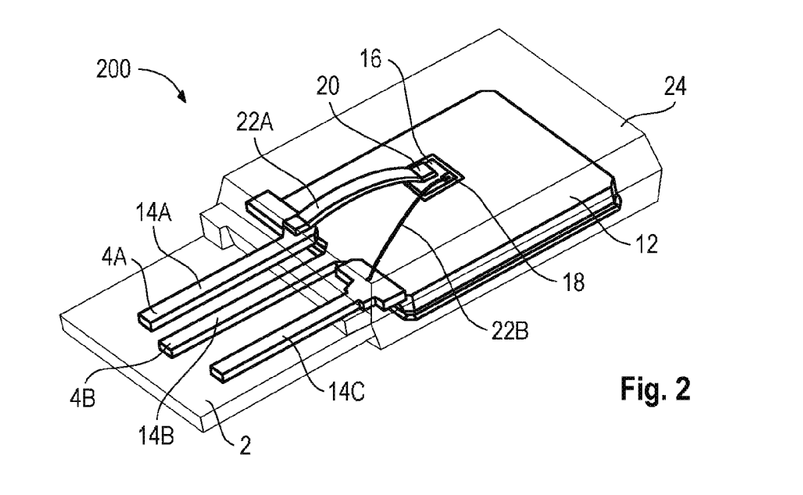
FIG. 2 schematically illustrates a perspective view of an electronic device 200 in accordance with the disclosure.

FIG. 2 schematically illustrates a perspective view of an electronic device 200 in accordance with the disclosure. Note that FIG. 2 shows a transparent view in order to illustrate an internal structure of the electronic device 200. The electronic device 200 may include a chip carrier which may e.g. be formed by a leadframe. The leadframe may include a diepad 12 and multiple leads 14A to 14C. For example, one or more of the components of the leadframe may be fabricated from metals and/or metal alloys, in particular at least one of copper, copper alloys, nickel, iron nickel, aluminum, aluminum alloys, steel, stainless steel, etc. In addition, one or more of the components of the leadframe may be coated with at least one of the following metals or alloys thereof: tin, silver, gold, palladium, nickel.

A semiconductor chip 16 may be arranged on the diepad 12. For example, the semiconductor chip 16 may be a compound semiconductor chip which may be made of e.g. SiC. In the example of FIG. 2, the semiconductor chip 16 may include a transistor, such as e.g. a MOSFET, with a gate contact 18 and a source contact 20 arranged on the top side of the semiconductor chip 16 facing away from the diepad 12. In addition, the semiconductor chip 16 may include a drain contact (not illustrated) arranged on the bottom side of the semiconductor chip 16 facing the diepad 12. In a further example, the semiconductor chip 16 may be or may include a bipolar junction transistor having an emitter contact, a collector contact and a base contact.

The source contact 20 of the semiconductor chip 16 may be electrically connected to the first lead 14A via a first electrical connection element 22A. The first lead 14A may thus form a source load electrode 4A of the electronic device 200. An end portion of the first lead 14A encapsulated by a mold material (or mold compound) 24 of the electronic device 200 may be formed in an L-shape in order to increase a surface area to which the first electrical connection element 22A may be connected to. In the example of FIG. 2, the first electrical connection element 22A may be formed by a ribbon. In further examples, the first electrical connection element 22A may be formed by a bond wire or a clip.

The gate contact 18 of the semiconductor chip 16 may be electrically connected to the third lead 14C via a second electrical connection element 22B. An end portion of the third lead 14C encapsulated by the mold material 24 may have an increased surface area to which the second electrical connection element 22B may be connected to. In the example of FIG. 2, the second electrical connection element 22B may be formed by a bond wire. In further examples, the second electrical connection element 22B may be formed by a ribbon or a clip. The third lead 14C may thus form a gate electrode of the electronic device 200.

The diepad 12 and the second lead 14B may be electrically connected and may e.g. be formed as a single piece. The drain electrode of the semiconductor chip 16 may be electrically connected to the second lead 14B via the diepad 12. The second lead 14B may thus form a drain load electrode 4B of the electronic device 200.

In the non-limiting example of FIG. 2, the electronic device 200 may exemplarily include (exactly) three leads (or pins), namely a source lead, a gate lead and a drain lead. In further examples, an electronic device in accordance with the disclosure may include one or more further leads. Such further lead(s) may be configured to provide one or more sensing signals. The sensing signal(s) may be based on or may depend on a physical parameter (or physical quantity or physical magnitude) of an electronic component included in the considered electronic device, for example an included semiconductor chip. The sensing signal may thus represent or may include information about a physical property of the electronic component that can be quantified by a measurement. For example, the sensing signal may correspond to one or more of a measured voltage, an electrical current, a temperature, etc. In one example, an electronic device in accordance with the disclosure may include (exactly) four leads (or pins), namely a source lead, a gate lead, a sense (or sensing) lead and a drain lead. In a further example, an electronic device in accordance with the disclosure may include (exactly) five leads (or pins), namely a source lead, a gate lead, a first sense lead, a second sense lead and a drain lead. In these two examples, the source lead, the gate lead and the drain lead may e.g. be arranged as shown and described in FIG. 2. The sense lead(s) may be arranged on the upper and/or bottom surface of an electrically insulating material 2.

Similar to FIG. 1 the load electrodes 4A, 4B may be arranged on the upper and bottom surface of an electrically insulating material 2, respectively. In addition, the gate electrode 14C may be arranged on the top surface of the electrically insulating material 2. In the example of FIG. 2, the load electrodes 4A, 4B may at least partly overlap when viewed in a direction perpendicular to the upper or bottom surface of the electrically insulating material 2. In the transparent view of FIG. 2 the second load electrode 14B is visible, although arranged on the bottom surface of the electrically insulating material 2. Note that in a real view the second load electrode 14B may be hidden behind a non-transparent electrically insulating material 2.

The semiconductor chip 16, the diepad 12 and the electrodes 14A to 14C may be at least partly encapsulated by the mold material 24. In the example of FIG. 2, the electrically insulating material 2 may be formed by or may be a part of the mold material 24. In this regard, the electrically insulating material 2 and the mold material 24 may be formed as one single piece. The mold material 24 may include at least one of the following materials: epoxy, filled epoxy, glass fiber filled epoxy, imide, thermoplast, thermoset polymer, polymer blend. The electrodes 14A to 14C may at least partly protrude out of the mold material 24 such that the electrical contacts of the semiconductor chip 16 may be electronically accessible from outside of the package body. In the example of FIG. 2, the electrodes 14A to 14C may protrude out of a same side surface of the mold material 24. In further examples of an electronic device in accordance with the disclosure, the electrodes may protrude out of multiple side surfaces of the mold material 24. In this regard, the electrodes may e.g. protrude out of two opposite side surfaces or out of all four side surfaces of the mold material 24.

Figure 3A:
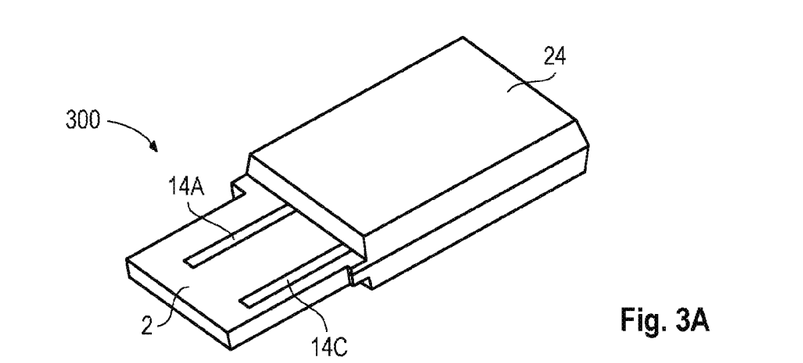
Figure 3B:
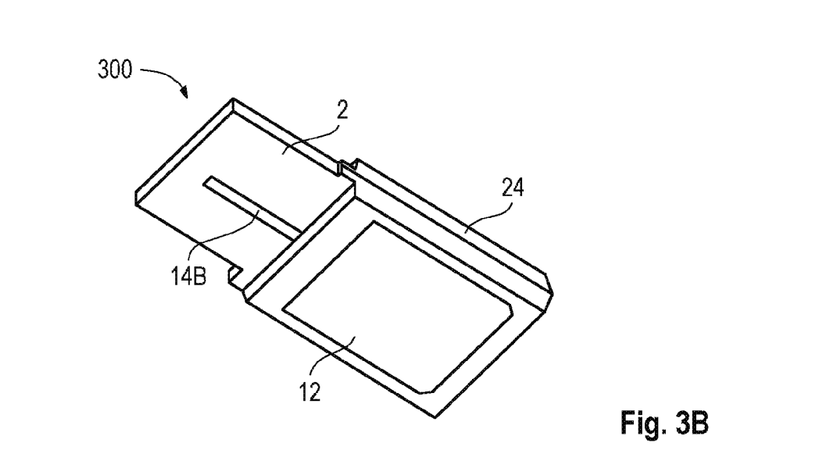

FIG. 3 includes FIGS. 3A and 3B schematically illustrating perspective views of an electronic device 300 in accordance with the disclosure. The electronic device 300 may be similar to the electronic device 200 of FIG. 2. In contrast to FIG. 2, the views of FIG. 3 are non-transparent such that an internal structure of the electronic device 300 is not shown. The electrically insulating material 2 may be formed by or may be a part of the mold material 24. The top surface of the electrically insulating material 2 and the top surfaces of the electrodes 14A, 14C may be arranged in a common plane, i.e. may be flush. In a similar fashion, the bottom surface of the electrically insulating material 2 may be flush with the bottom surface of the electrode 14B. Furthermore, the bottom surface of the mold material 24 may be flush with the bottom surface of the diepad 12. The bottom surface of the diepad 12 may be uncovered by the mold material 24 such that a heatsink (not illustrated) may be arranged over the exposed surface. Thermal grease may be arranged between the exposed surface of the diepad 12 and the heatsink. During an operation of the electronic device 300 heat generated by e.g. the semiconductor chip 16 may be dissipated along a path extending from the semiconductor chip 16 to the heatsink.

Figure 4A:
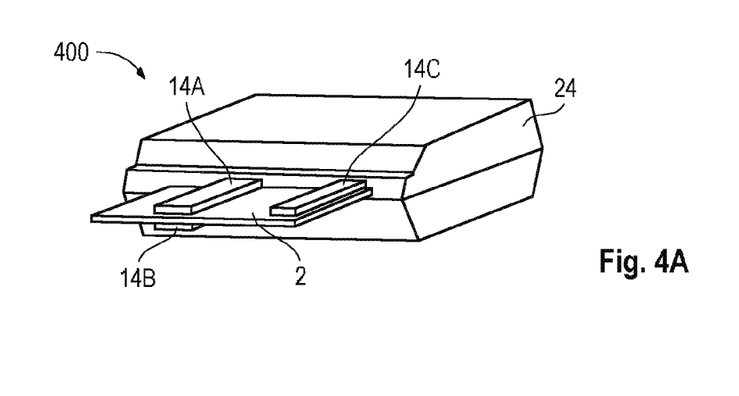
Figure 4B:
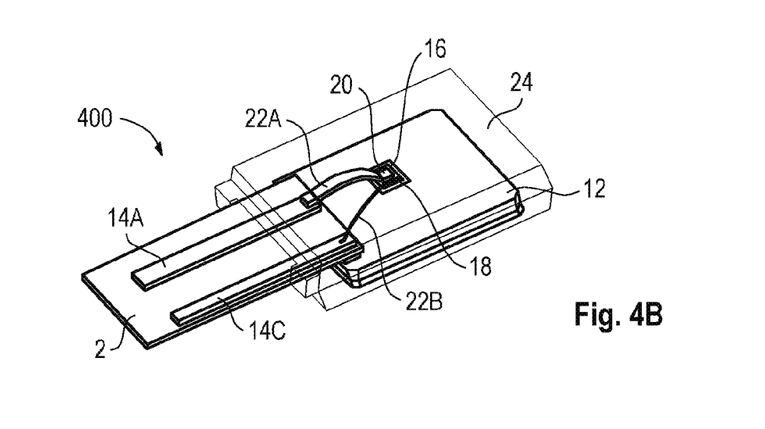

FIG. 4 includes FIGS. 4A and 4B schematically illustrating perspective views of an electronic device 400 in accordance with the disclosure. FIG. 4B is a transparent view in order to illustrate an internal structure of the electronic device 400. In contrast to FIG. 2 or 3, the electrically insulating material 2 and the mold material 24 of FIG. 4 may be made of different materials and may be formed as two pieces that may be mechanically connected. In one example, the electrically insulating material 2 may include or may be made of a dielectric printed circuit board material, for example an epoxy material which may be filled with a glass fabric (e.g. FR-4). The electrically insulating material 2 with the electrodes 4A to 4C arranged thereon may at least partly extend into the mold material 24. In the example of FIG. 4, the electrodes 14A to 14C are illustrated to have a linear shape. In further examples, the electrodes 14A to 14C may be formed as illustrated in e.g. FIG. 2.

Figure 5A:
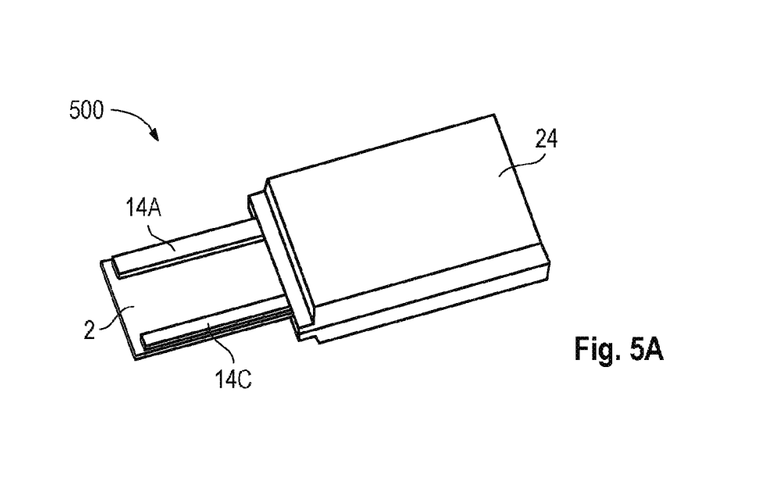
Figure 5B:
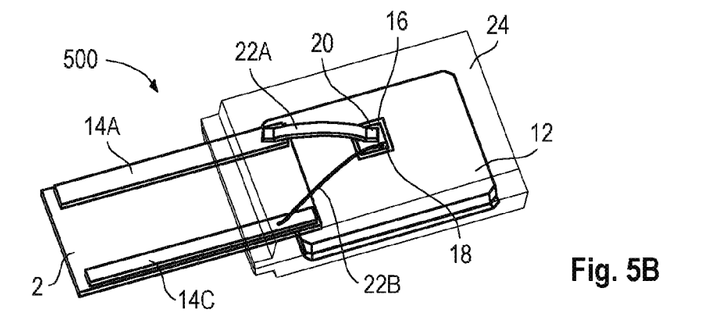

FIG. 5 includes FIGS. 5A and 5B schematically illustrating perspective views of an electronic device 500 in accordance with the disclosure. FIG. 5B is a transparent view in order to illustrate an internal structure of the electronic device 500. The electronic device 500 may at least partly be similar to the electronic device 400 of FIG. 4. Similar to FIG. 4 the electrically insulating material 2 and the mold material 24 may be made of different materials and may be formed as two pieces that may be mechanically connected. In the example of FIG. 5, the electrically insulating material 2 may include or may be made of a ceramic material or a mixed material mostly including ceramic particles. Here, the ceramic particles can make up more than about 50 percent or more than about 60 percent or more than about 70 percent or more than about 80 percent or more than about 90 percent of the mixed material. For example, the mixed material may be epoxy based. In contrast to FIG. 4, the electrodes 14A, 14B may be located closer to the side edges of the electrically insulating material 2.

Figure 6A:
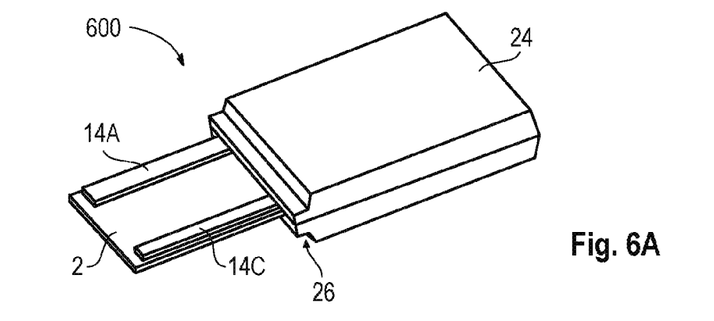
Figure 6B:
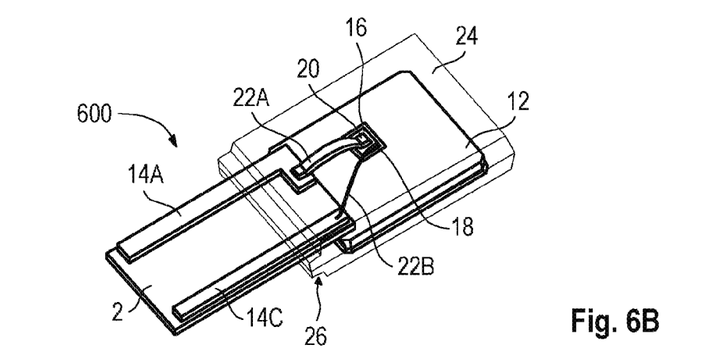

FIG. 6 includes FIGS. 6A and 6B schematically illustrating perspective views of an electronic device 600 in accordance with the disclosure. FIG. 6B is a transparent view in order to illustrate an internal structure of the electronic device 600. The electronic device 600 may at least partly be similar to the electronic device 500 of FIG. 5. For example, the electrically insulating material 2 of FIG. 6 may be the same as in one of FIG. 4 or 5. In contrast to FIG. 5, an end portion of the first lead 14A encapsulated by the mold material 24 may be L-shaped in order to increase a surface area to which the first electrical connection element 22A may be connected to. At least one trench 26 may be formed in a surface of the mold material 24. The at least one trench 26 may be configured to increase a creepage distance between electrically conductive components, in particular electrodes, of the electronic device 600. In the example of FIG. 6, one trench 26 may extend along an edge of the bottom surface of the package body. The trench 26 may e.g. be configured to increase a creepage distance to the exposed surface of the diepad 12 arranged on the bottom side of the electronic device 600.

Figure 7A:
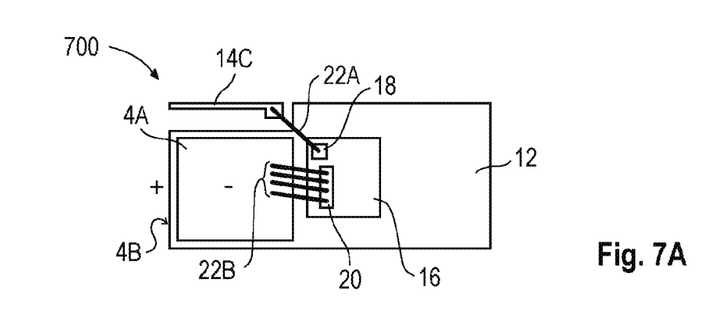
Figure 7B:
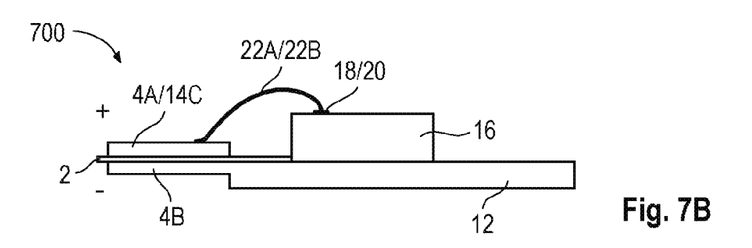

FIG. 7 includes FIGS. 7A and 7B schematically illustrating a top view and a cross-sectional side view of an electronic device 700 in accordance with the disclosure. Note that for illustrative purposes an optional mold material of the electronic device 700 is not shown. In the side view of FIG. 7B, the gate electrode 14C may be hidden behind the load electrode 4A. In a similar fashion, the first electrical connection element 22A may be hidden behind the second electrical connection elements 22B. In the example of FIG. 7, an electrical connection between the load electrode 4A and the source contact 20 of the semiconductor chip 16 may be established via multiple bond wires. In contrast to e.g. FIG. 2, the load electrodes 4A, 4B may be formed wide and flat in order to increase a current carrying capacity and to reduce an effective parasitic inductance. In the top view of FIG. 7A, the surface areas of the load electrodes 4A, 4B may be multiple times larger than the surface area of the gate electrode 14C, respectively.

Figure 8A:
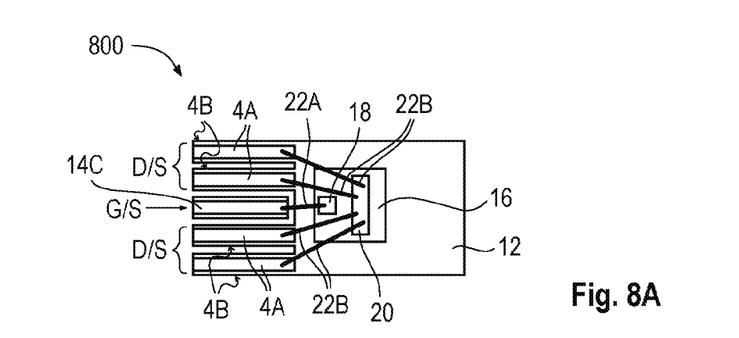
Figure 8B:
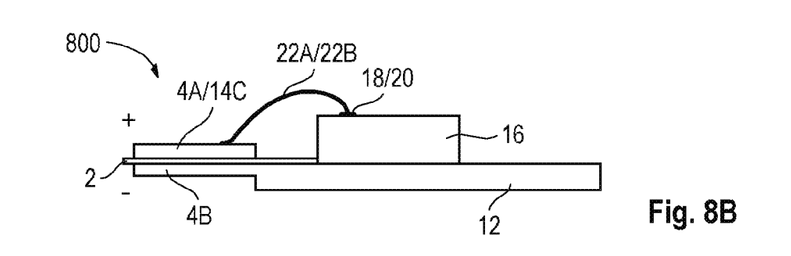

FIG. 8 includes FIGS. 8A and 8B schematically illustrating a top view and a cross-sectional side view of an electronic device 800 in accordance with the disclosure. Similar to FIG. 7 an optional mold material of the electronic device 800 is not shown, and in the side view of FIG. 8B some components may be hidden behind other components. At least one of the load electrodes 4A, 4B may be formed comb-shaped. In particular, each of the load electrodes 4A, 4B may be formed by an arbitrary number of multiple leads of a leadframe. In this regard, the number of leads forming the source load electrode 4A and the number of leads forming the drain load electrode 4B may be equal or may differ. In the example of FIG. 8, the source load electrode 4A and the drain load electrode 4B may be formed by four leads, respectively. Further, a width of the leads forming the source load electrode 4A may be smaller than or equal to a width of the leads forming the drain load electrode 4B. In the example of FIG. 8, the lead 14C forming the gate electrode may be arranged between the leads of the load electrodes 4A, 4B. In further examples, the location of the lead forming the gate electrode 14C may be exchanged with a location of any of the leads forming the load electrodes 4A, 4B.

Figure 9:
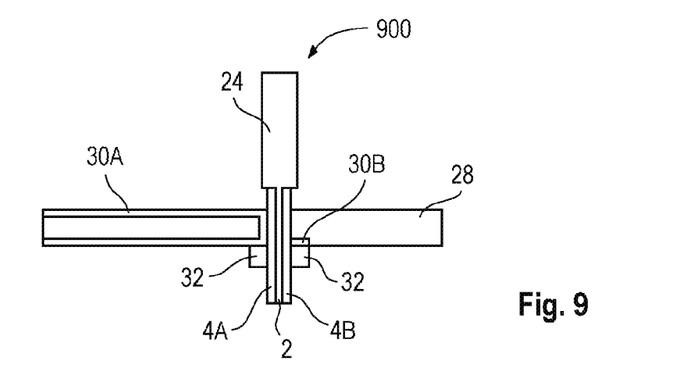
FIG. 9 schematically illustrates a cross-sectional side view of a system including an electronic device 900 in accordance with the disclosure mounted to a printed circuit board (PCB).

FIG. 9 schematically illustrates a cross-sectional side view of a system including an electronic device 900 in accordance with the disclosure. The electronic device 900 may be mounted to a printed circuit board (PCB) 28. The PCB 28 may be seen as a part of the electronic device 900 or not. The electronic device 900 may be electrically and mechanically connected to the PCB 28 by any suitable technique. In particular, the electronic device 900 may be soldered to the PCB 28 by means of a solder joint. The electrodes 4A, 4B of the electronic device 900 may be plugged into a through hole of the PCB 28 and may be fixed to the PCB 28 by means of a solder material 32. The package body 24 of the mounted electronic device 900 and the solder material 32 may be arranged on opposite surfaces of the PCB 28. The PCB 28 may include a first metallization 30A and a second metallization 30B. The source load electrode 4A and the drain load electrode 4B may be in contact with and electrically connected to the first metallization 30A and the second metallization 30B, respectively.

Figure 10A:
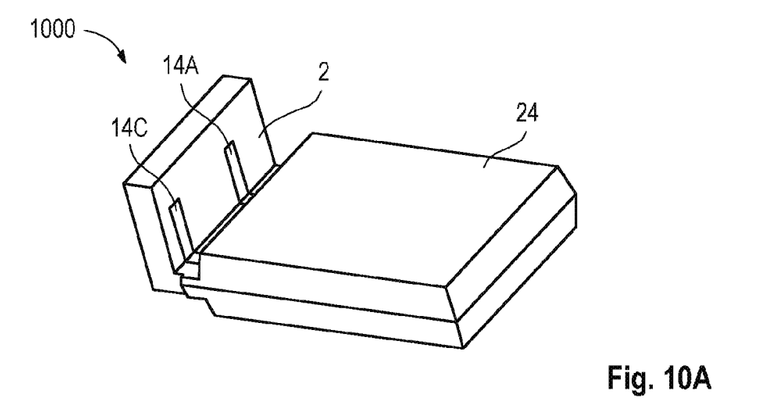
Figure 10B:
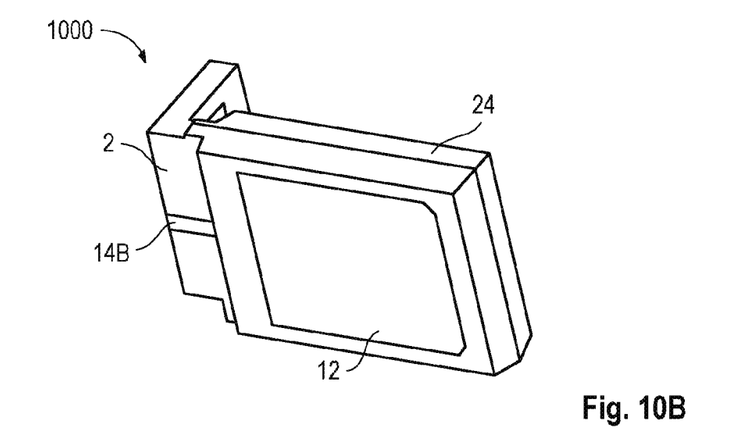

FIG. 10 includes FIGS. 10A and 10B schematically illustrating perspective views of an electronic device 1000 in accordance with the disclosure. The electronic device 1000 may be similar to the electronic device 300 of FIG. 3. In contrast to FIG. 3, the electrodes 14A to 14C or parts thereof may be substantially perpendicular to the diepad 12. More general, the electrodes 14A to 14C and the diepad 12 may form an angle of greater than about 70 degrees or greater than about 80 degrees or greater than about 85 degrees. In the example of FIG. 10, the electrodes 14A to 14C and the electrically insulating material 2 may be bent or may extend in a direction away from the exposed bottom surface of the diepad 12. When the electronic device 1000 is mounted on a PCB, the exposed bottom surface of the diepad 12 may thus face away from the PCB such that a heatsink may be arranged over the exposed surface for cooling purposes. In a further example, the electrodes 14A to 14C and the electrically insulating material 2 may be bent or may extend in the opposite direction such that the exposed bottom surface of the diepad 12 may face the PCB when mounted thereon. In such case, the exposed bottom surface may be in contact with the PCB such that the electronic device 1000 may be cooled via the PCB.

Figure 11:
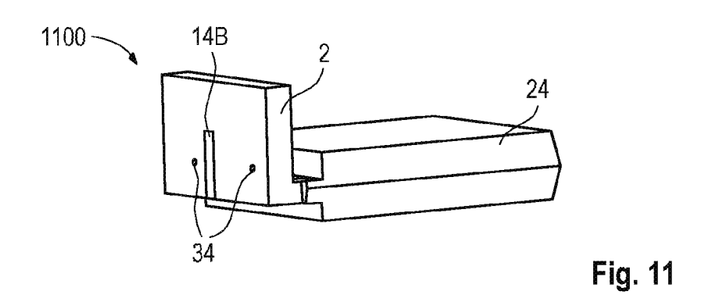
FIG. 11 schematically illustrates a perspective view of an electronic device 1100 in accordance with the disclosure.

FIG. 11 schematically illustrates a perspective view of an electronic device 1100 in accordance with the disclosure. The electronic device 1100 may be similar to the electronic device 1000 of FIG. 10. In contrast to FIG. 10, one or multiple holes or recesses 34 may extend into the mold material 24 of the electronic device 1100. For example, the holes 34 may result from using retractable pins (not illustrated) during the fabrication of the electronic device 1100. In particular, the holes 34 may be configured to avoid or reduce a flash of the mold material 24. An exemplary method for manufacturing an electronic device in accordance with the disclosure including an optional use of retractable pins is discussed in connection with FIGS. 12 and 13.

Figure 12:
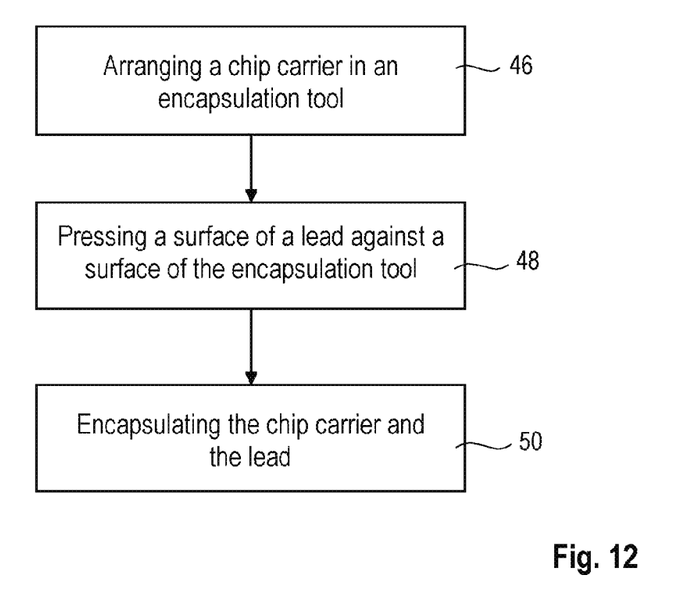
FIG. 12 illustrates a flowchart of a method for manufacturing an electronic device in accordance with the disclosure.

FIG. 12 illustrates a flowchart of a method for manufacturing an electronic device in accordance with the disclosure. The method is described in a general manner in order to qualitatively specify aspects of the disclosure. The method of FIG. 12 may include further aspects. For example, the method of FIG. 12 may be extended by any of the aspects described in connection with the method of FIG. 13.

At 46, a chip carrier is arranged in an encapsulation tool, wherein a first lead of the chip carrier is configured as a contact electrode of the manufactured electronic device. At 48, a surface of the first lead is pressed against a first surface of the encapsulation tool by means of a first retractable pin. At 50, the chip carrier and the first lead are encapsulated by arranging an encapsulation material in the encapsulation tool, wherein the surface of the first lead is uncovered by the encapsulation material after encapsulating the chip carrier and the first lead. In an optional further act (not illustrated), a surface of a second lead of the chip carrier may be pressed against a second surface of the encapsulation tool by means of a second retractable pin, wherein the surface of the second lead is uncovered by the encapsulation material after encapsulating the chip carrier and the second lead.

FIG. 13 includes FIGS. 13A to 13F schematically illustrating a cross-sectional side view of a method for manufacturing an electronic device in accordance with the disclosure. The method of FIG. 13 can be seen as a more detailed version of the method of FIG. 12.

Figure 13A:
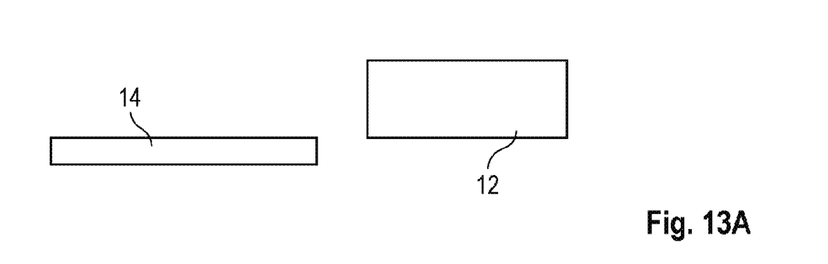

In FIG. 13A, a chip carrier including a diepad 12 and one or multiple leads 14 may be provided. For example, the chip carrier may be a leadframe made of a metal and/or a metal alloy. Due to the perspective of FIG. 13A further leads may be hidden behind the illustrated lead 14. A semiconductor chip may be arranged over the diepad 12, wherein the semiconductor chip may be electrically connected to the lead 14 via one or more electrical connection elements. For the sake of simplicity, such further components are not illustrated in the example of FIG. 13. Exemplary arrangements including a semiconductor chip and electrical connection elements are described in connection with foregoing figures. The lead 14 may be configured as a contact electrode, in particular a load electrode, of the electronic device to be manufactured.

Figure 13B:
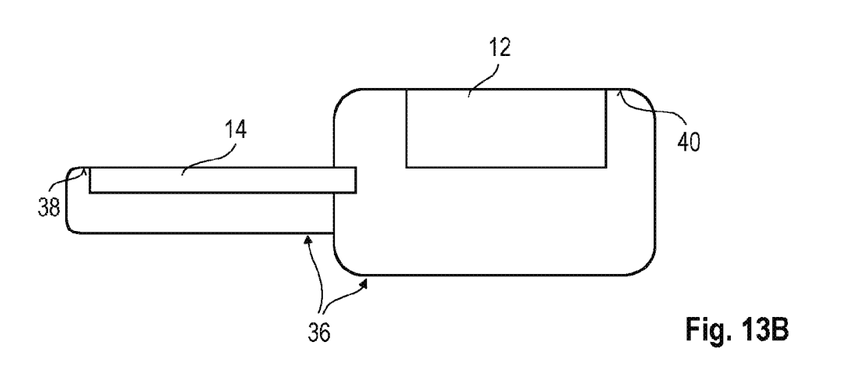

In FIG. 13B, the die pad 12 and the lead 14 may be arranged in an encapsulation tool 36. For example, the encapsulation tool 36 may be a mold tool configured to be used in a molding process. The form of the encapsulation tool 36 may correspond to a form of an encapsulation material or a package body of the electronic device to be manufactured. For example, the form of the encapsulation tool 36 in FIG. 13 may be similar to the form of the mold material 24 of electronic devices described in connection with previous figures. In the example of FIG. 13B, the lead 14 and the diepad 12 may be arranged on (inner) surfaces 38 and 40 of the encapsulation tool 36, respectively.

Figure 13C:
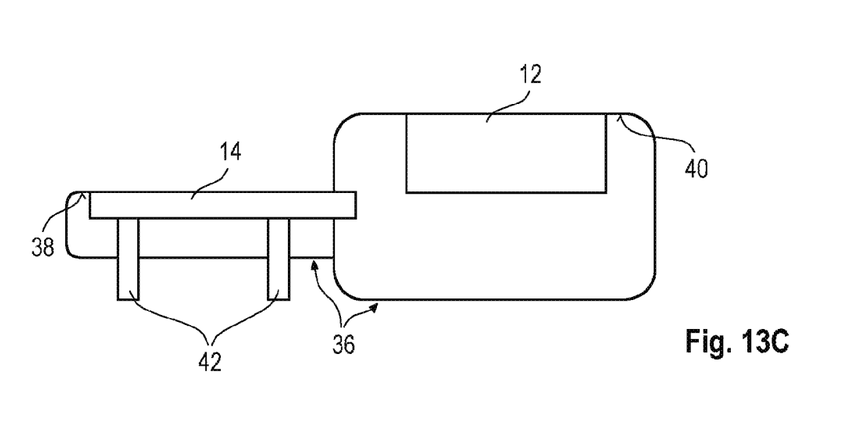

In FIG. 13C, the upper surface of the lead 14 may be pressed against the surface 38 of the encapsulation tool 36 by means of one or more retractable pins 42. In the example of FIG. 13C, multiple (e.g. two) retractable pins 42 may be used in order to provide a continuous an increased contact between the upper surface of the lead 14 and the surface 38 of the encapsulation tool 36.

Figure 13D:
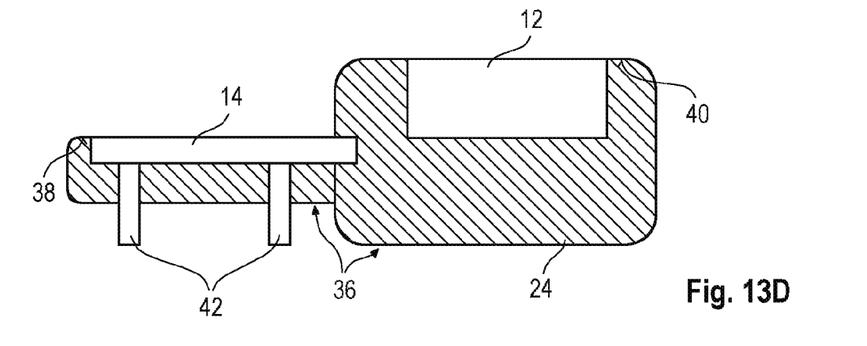

In FIG. 13D, the cavity of the encapsulation tool 36 may be filled with an encapsulation material such as e.g. a mold material (or mold compound) 24. For example, a transfer molding act may be applied for at least partly encapsulating the lead 14, the diepad 12 and further components (not illustrated) that may be arranged in the encapsulation tool 36. Due to the contact between the upper surface of the lead 14 and the inner surface of the encapsulation tool 36, the upper surface of the lead 14 may remain uncovered by the mold material 24.

Figure 13E:
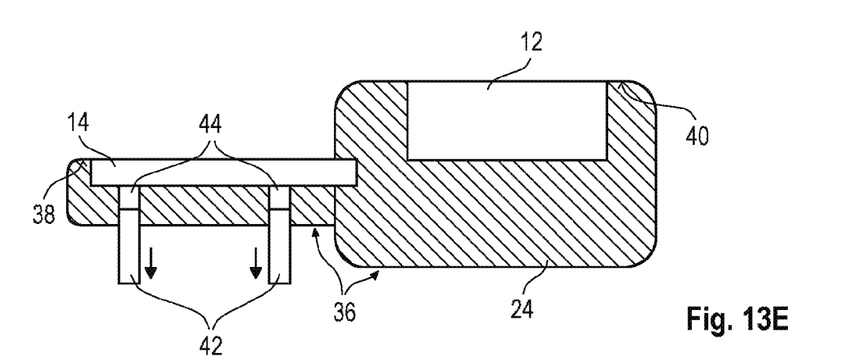

In FIG. 13E, the retractable pin(s) 42 may be at least partly retracted or pushed back in a downward direction (see arrows), wherein cavities 44 between the retractable pin(s) 42 and the lead 14 may be formed. The contact between the upper surface of the lead 14 and the inner surface 38 of the encapsulation tool 36 may be provided by the mold material 24.

Figure 13F:
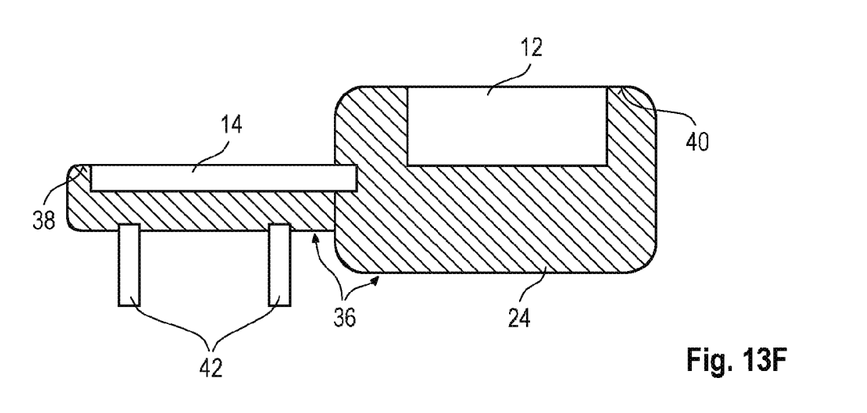

In FIG. 13F, the cavities 44 may be filled with mold material 24 during an application of an end-pressure. In further optional acts (not illustrated), the mold material 24 may be cured, the packaged electronic device may be ejected from the cavity of the encapsulation tool 36 by means of an e(ejection)-pin, and/or the retractable pin(s) 42 may be (completely) removed. After ejecting the packaged electronic device from the cavity, the upper surface of the lead 14 may be uncovered by the mold material 24.

In the example of FIG. 13, the upper surface of the lead 14 may be pressed against the upper inner surface of the encapsulation tool 36 such that the upper surface of the lead 14 may be uncovered by the mold material 24 after the molding act. In addition, a surface of a second lead (not illustrated) may be pressed against a second (inner) surface of the encapsulation tool 36 by means of one or more second retractable pins (not illustrated). In particular, a lower surface of the second lead may be pressed against a lower inner surface of the encapsulation tool 36 such that the lower surface of the second lead may be uncovered by the mold material 24 after the molding act. This way, electronic devices in accordance with the disclosure as described in connection with previous figures may be manufactured, wherein load electrodes are separated by the mold material 24 along the entire length on which the load electrodes have opposite sections, and wherein surfaces of the load electrodes facing away from the mold material 24 are uncovered by the mold material 24.

Examples

In the following, electronic devices including electrically insulated load electrodes will be explained by means of examples.

Example 1 is an electronic device, comprising: an electrically insulating material; a first load electrode arranged on a first surface of the electrically insulating material; and a second load electrode arranged on a second surface of the electrically insulating material opposite to the first surface, wherein the load electrodes are separated by the electrically insulating material along the entire length on which the load electrodes have opposite sections, wherein surfaces of the load electrodes facing away from the electrically insulating material are uncovered by the electrically insulating material.

Example 2 is an electronic device according to Example 1, wherein the load electrodes are separated by the electrically insulating material by a distance of smaller than 2.0 mm.

Example 3 is an electronic device according to Example 1 or 2, wherein, when viewed in a direction perpendicular to the first surface or the second surface, the electrically insulating material extends over at least one side surface of at least one of the load electrodes.

Example 4 is an electronic device according to one of the preceding Examples, wherein, when viewed in a direction perpendicular to the first surface or the second surface, the electrically insulating material extends over at least one end portion of at least one of the load electrodes.

Example 5 is an electronic device according to one of the preceding Examples, wherein, when viewed in a direction perpendicular to the first surface or the second surface, the load electrodes at least partly overlap.

Example 6 is an electronic device according to one of the preceding Examples, wherein a surface of the electrically insulating material and at least one of the uncovered surfaces of the load electrodes are arranged in a common plane.

Example 7 is an electronic device according to one of the preceding Examples, further comprising: a chip carrier comprising a diepad and multiple leads, wherein the load electrodes are formed by the leads of the chip carrier; and a semiconductor chip arranged on the diepad, wherein the load electrodes are electrically connected to the semiconductor chip.

Example 8 is an electronic device according to Example 7, wherein at least one of the load electrodes and the diepad form an angle of greater than 70 degrees.

Example 9 is an electronic device according to Example 7 or 8, further comprising: a mold material, wherein the semiconductor chip and the chip carrier are at least partly encapsulated by the mold material, wherein the electrically insulating material is formed by the mold material.

Example 10 is an electronic device according to Example 9, wherein the mold material comprises at least one of the following materials: epoxy, filled epoxy, glass fiber filled epoxy, imide, thermoplast, thermoset polymer, polymer blend.

Example 11 is an electronic device according to Example 9 or 10, further comprising: at least one trench formed in a surface of the mold material, wherein the at least one trench is configured to increase a creepage distance between electrodes of the electronic device.

Example 12 is an electronic device according to one of Examples 1 to 8, wherein the electrically insulating material comprises at least one of the following materials: dielectric printed circuit board material, ceramic material, polyimide, plastic, epoxy.

Example 13 is an electronic device according to one of the preceding Examples, wherein at least one of the load electrodes is formed comb-shaped.

Example 14 is an electronic device according to one of the preceding Examples, wherein at least one of the load electrodes is coated with at least one of the following metals or alloys thereof: tin, silver, gold, palladium, nickel.

Example 15 is an electronic device according to one of the preceding Examples, wherein the electronic device is configured to operate at a frequency of higher than 30 kHz.

Example 16 is an electronic device according to one of the preceding Examples, wherein the electronic device is configured to operate at a maximum voltage of higher than 600V.

Example 17 is an electronic device according to one of Examples 7 to 16, wherein: the semiconductor chip comprises a transistor, and the load electrodes form a drain and a source of the transistor or form an emitter and a collector of the transistor.

Example 18 is an electronic device according to one of the preceding Examples, further comprising: a printed circuit board, wherein the electronic device is electrically and mechanically connected to the printed circuit board.

Example 19 is a method for manufacturing an electronic device, the method comprising: arranging a chip carrier in an encapsulation tool, wherein a first lead of the chip carrier is configured as a contact electrode of the manufactured electronic device; pressing a surface of the first lead against a first surface of the encapsulation tool by means of a first retractable pin; and encapsulating the chip carrier and the first lead by arranging an encapsulation material in the encapsulation tool, wherein the surface of the first lead is uncovered by the encapsulation material after encapsulating the chip carrier and the first lead.

Example 20 is a method according to Example 19, further comprising: pressing a surface of a second lead of the chip carrier against a second surface of the encapsulation tool by means of a second retractable pin, wherein the surface of the second lead is uncovered by the encapsulation material after encapsulating the chip carrier and the second lead.

As employed in this description, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the words "over" or "on" used with regard to e.g. a material layer formed or located "over" or "on" a surface of an object may be used herein to mean that the material layer may be located (e.g. formed, deposited, etc.) "directly on", e.g. in direct contact with, the implied surface. The words "over" or "on" used with regard to e.g. a material layer formed or located "over" or "on" a surface may also be used herein to mean that the material layer may be located (e.g. formed, deposited, etc.) "indirectly on" the implied surface with e.g. one or more additional layers being arranged between the implied surface and the material layer.

Furthermore, to the extent that the terms "having", "containing", "including", "with" or variants thereof are used in either the detailed description or the claims, such terms are intended to be inclusive in a manner similar to the term "comprising". That is, as used herein, the terms "having", "containing", "including", "with", "comprising" and the like are open-ended terms that indicate the presence of stated elements or features, but do not preclude additional elements or features.

Moreover, the word "exemplary" is used herein to mean serving as an example, instance, or illustration. Any aspect or design described herein as "exemplary" is not necessarily to be construed as advantageous over other aspects or designs. Rather, use of the word "exemplary" is intended to present concepts in a concrete fashion.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. An electronic device, comprising:
an electrically insulating material;
a first load electrode arranged on a first surface of the electrically insulating material; and
a second load electrode arranged on a second surface of the electrically insulating material opposite to the first surface,
wherein the load electrodes are separated by the electrically insulating material along the entire length on which the load electrodes have opposite sections,
wherein surfaces of the load electrodes facing away from the electrically insulating material are uncovered by the electrically insulating material;
wherein the electrically insulating material, when viewed in a direction perpendicular to the first surface or the second surface, extends beyond at least one side surface of at least one of the load electrodes;
the electronic device further including a chip carrier comprising multiple leads, wherein the leads of the chip carrier form the load electrodes, and wherein a portion of the load electrodes are exposed from the electrically insulating material for connection to external devices.

2. The electronic device of claim 1, wherein the load electrodes are separated by the electrically insulating material by a distance of smaller than 2.0 mm.

3. The electronic device of claim 1, wherein, when viewed in a direction perpendicular to the first surface or the second surface, the electrically insulating material extends beyond at least one end portion of at least one of the load electrodes.

4. The electronic device of claim 1, wherein, when viewed in a direction perpendicular to the first surface or the second surface, the load electrodes at least partly overlap.

5. The electronic device of claim 1, wherein a surface of the electrically insulating material and at least one of the uncovered surfaces of the load electrodes are arranged in a common plane.

6. The electronic device of claim 1, the chip carrier further including a diepad, the electronic device further comprising:
a semiconductor chip arranged on the diepad, wherein the load electrodes are electrically connected to the semiconductor chip.

7. The electronic device of claim 6, wherein at least one of the load electrodes and the diepad form an angle of greater than 70 degrees.

8. The electronic device of claim 6, further comprising:
a mold material, wherein the semiconductor chip and the chip carrier are at least partly encapsulated by the mold material, wherein the electrically insulating material is formed by the mold material.

9. The electronic device of claim 8, wherein the mold material comprises at least one of the following materials: epoxy, filled epoxy, glass fiber filled epoxy, imide, thermoplast, thermoset polymer, polymer blend.

10. An electronic device, comprising:
an electrically insulating material;
a first load electrode arranged on a first surface of the electrically insulating material; and
a second load electrode arranged on a second surface of the electrically insulating material opposite to the first surface,
wherein the load electrodes are separated by the electrically insulating material along the entire length on which the load electrodes have opposite sections,
wherein surfaces of the load electrodes facing away from the electrically insulating material are uncovered by the electrically insulating material;
wherein the electrically insulating material, when viewed in a direction perpendicular to the first surface or the second surface, extends beyond at least one side surface of at least one of the load electrodes;
the electronic device further comprising:
a chip carrier comprising a diepad and multiple leads, wherein the load electrodes are formed by the leads of the chip carrier;
a semiconductor chip arranged on the diepad, wherein the load electrodes are electrically connected to the semiconductor chip; and
at least one trench formed in a surface of the mold material, wherein the at least one trench is configured to increase a creepage distance between electrodes of the electronic device.

11. The electronic device of claim 1, wherein the electrically insulating material comprises at least one of the following materials: dielectric printed circuit board material, ceramic material, polyimide, plastic, epoxy.

12. The electronic device of claim 1, wherein at least one of the load electrodes is formed comb-shaped.

13. The electronic device of claim 1, wherein at least one of the load electrodes is coated with at least one of the following metals or alloys thereof: tin, silver, gold, palladium, nickel.

14. The electronic device of claim 1, wherein the electronic device is configured to operate at a frequency of higher than 30 kHz.

15. The electronic device of claim 6, wherein:
the semiconductor chip comprises a transistor, and
the load electrodes form a drain and a source of the transistor or form an emitter and a collector of the transistor.

16. The electronic device of claim 1, further comprising:
a printed circuit board, wherein the electronic device is electrically and mechanically connected to the printed circuit board.

17. A method for manufacturing an electronic device, the method comprising:
arranging a chip carrier in an encapsulation tool, a first connection conductor of the chip carrier being designed as a first load electrode contact electrode of the electronic device to be produced and a second connection conductor of the chip carrier being designed as a second load electrode of the electronic device to be produced;
pressing a surface of the first lead against a first surface of the encapsulation tool by a first retractable pin;
pressing a surface of the second lead of the chip carrier against a second surface of the encapsulation tool by a second retractable pin; and
encapsulating the chip carrier and the first and second connection conductors by arranging an encapsulation material in the encapsulation tool, the pressed surface of the first connection conductor and the pressed surface of the second connection conductor being uncovered by the encapsulation material after the encapsulation of the chip carrier and the first and second connection conductors are uncovered by the encapsulation material; and wherein the load electrodes are separated by the encapsulation material over the entire length, on which the load electrodes have opposite sections, the encapsulation material, if in a direction perpendicular to the first surface or the considered second surface, extends beyond at least one side surface of at least one of the load electrodes and wherein the encapsulation material is electrically insulating, where at least a portion of the load electrodes are exposed from the encapsulation material for connection to external devices.

* * * * *